(12) United States Patent
Bryant et al.

(10) Patent No.: US 10,648,292 B2
(45) Date of Patent: May 12, 2020

(54) COGNITIVE ENHANCED OIL RECOVERY ADVISOR SYSTEM BASED ON DIGITAL ROCK SIMULATOR

(71) Applicant: International Business Machines Corporation, Armonk, NY (US)

(72) Inventors: Peter William Bryant, Rio De Janeiro (BR); Rodrigo Neumann Barros Ferreira, Rio De Janeiro (BR); Ronaldo Giro, Rio De Janeiro (BR); Mathias B Steiner, Rio De Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 604 days.

(21) Appl. No.: 15/446,497

(22) Filed: Mar. 1, 2017

(65) Prior Publication Data

US 2018/0252076 A1 Sep. 6, 2018

(51) Int. Cl.
| | |
|---|---|
| *E21B 41/00* | (2006.01) |
| *E21B 49/00* | (2006.01) |
| *E21B 49/02* | (2006.01) |
| *E21B 43/16* | (2006.01) |
| *C09K 8/58* | (2006.01) |
| *G06N 5/04* | (2006.01) |

(52) U.S. Cl.
CPC ............ *E21B 41/0092* (2013.01); *C09K 8/58* (2013.01); *E21B 43/16* (2013.01); *E21B 49/00* (2013.01); *E21B 49/02* (2013.01); *G06N 5/045* (2013.01)

(58) Field of Classification Search
CPC ...... E21B 41/0092; E21B 43/16; E21B 49/00; E21B 49/02; G06N 5/045

USPC .......................................................... 703/10
See application file for complete search history.

(56) References Cited

U.S. PATENT DOCUMENTS

| | | |
|---|---|---|
| 7,707,013 B2 | 4/2010 | Valdez et al. |
| 7,784,539 B2 | 8/2010 | Montaron |
| | (Continued) | |

OTHER PUBLICATIONS

Koroteev et al., "Application of Digital Rock Technology for Chemical EOR Screening", SPE 165258, 2013 Society of Petroleum Engineers, prepared for presentation at SPE Enhanced Oil Recovery Conference held in Kual Lumpur, Malaysia Jul. 2-4, 2013.

(Continued)

*Primary Examiner* — Brian S Cook
(74) *Attorney, Agent, or Firm* — Harrington & Smith (57) ABSTRACT

A method is provided including calculating a first property vector indicative of physical properties derived from a digital image of a first rock sample; determining a set of one or more similar rock samples by calculating a value indicating a similarity between the first rock sample and second rock samples based on the first property vector and second property vectors associated with the second rock samples; selecting a list of fluid additives based on existing enhanced fluid recovery efficiency values associated with the similar rock samples; performing, for each of the fluid additives, a simulation of a flow of fluid through a digital model of the first rock to determine a simulated enhanced fluid recovery efficiency value for the respective fluid additives; and outputting an optimal fluid additive for the first rock sample based at least in part on the calculated similarity values and simulated enhanced fluid recovery efficiency values.

20 Claims, 5 Drawing Sheets

(56) References Cited

U.S. PATENT DOCUMENTS

| | | | |
|---|---|---|---|
| 7,966,164 | B2 | 6/2011 | Valdez et al. |
| 8,046,314 | B2 | 10/2011 | Graf et al. |
| 8,081,802 | B2 | 12/2011 | Dvorkin et al. |
| 8,155,377 | B2 | 4/2012 | Dvorkin et al. |
| 8,175,751 | B2 | 5/2012 | Thakur et al. |
| 8,311,743 | B2 | 11/2012 | Gurpinar |
| 8,589,130 | B2 | 11/2013 | Stukan et al. |
| 8,725,477 | B2 | 5/2014 | Zhang et al. |
| 8,908,925 | B2 | 12/2014 | Hurley et al. |
| 9,316,096 | B2 | 4/2016 | Bang et al. |
| 2007/0143025 | A1 | 6/2007 | Valdez et al. |
| 2012/0221306 | A1 | 8/2012 | Hurley et al. |
| 2012/0330553 | A1 | 12/2012 | Mollaei et al. |
| 2013/0308837 | A1 | 11/2013 | Dvorkin et al. |
| 2013/0338976 | A1 | 12/2013 | De Prisco et al. |
| 2014/0019054 | A1 | 1/2014 | De Prisco et al. |
| 2014/0044315 | A1 | 2/2014 | Derzhi et al. |
| 2014/0058676 | A1 | 2/2014 | De Prisco et al. |
| 2014/0067347 | A1 | 3/2014 | Gurpinar et al. |
| 2014/0303951 | A1 | 10/2014 | Houeto et al. |
| 2016/0063150 | A1* | 3/2016 | Safonov ................ E21B 43/16 703/10 |
| 2016/0177686 | A1 | 6/2016 | Carvajal et al. |
| 2016/0194940 | A1 | 7/2016 | Andersen et al. |
| 2017/0286802 | A1* | 10/2017 | Mezghani ............... E21B 49/02 |

OTHER PUBLICATIONS

Daian et al., "3D Reconstitution of Porous Media from Image Processing Data using a Multicase Percolation System", Journal of Petroleum Science and Engineering, Oct. 16, 2003.

Fernandes et al., "Multiscale Geometrical Reconstruction of Porous Structures", Physical Review E, vol. 54, No. 2, Aug. 1996.

Liang et al., "A Reconstruction Technique for Three-Dimensional Porous Media Using Image Analysis and Fourier Transforms", Journal of Petroleum Science and Engineering, (Jul. 21, 1998) pp. 273-283.

Huang et al, "Proposed Approximation for Contact Angles in Shan-and-Chen-type Multicomponent Multiphase Lattice Boltzmann Models", Physical Review E 76, 2007.

Schmieschek et al., "Contact Angle Determination in Multicomponent Lattice Boltzmann Simulations", Commun. Comput. Phys. vol. 9, No. 5, pp. 1165-1178, May 2011.

Tartakovsky et al., "Modeling of Surface Tension and Contact Angles with Smoothed Particle Hydrodynamics", Physical Review E 72, 026301, 2005.

Das et al., "Equilibrium Shape and Contact Angle of Sessile Drops of Different Volumes—Computation by SPH and its Further Improvement by DI", Chemical Engineering Science, 2010, pp. 4027-4037.

Liu et all, "Modeling of Contact Angles and Wetting Effects with Particle Methods", International Journal of Computational Methods, vol. 9, No. 4 (2011), 637-651.

Henrich et al., "An Adhesive DPD Wall Model for Dynamic Wetting", A Letters Journal Exploring the Frontiers of Physics, Dec. 2007.

Lin et al., "Surface Wettability and Contact Angle Analysis by Dissipative Particle Dynamics", Interaction and Multiscale Mechanics, vol. 5, No. 4 (2012) p. 399-405.

http://www.fei.com/software/avizo-3d-for-digital-rock-and-core-analysis/ Avizo 3D Software for Core Sample and Digital Rock Anaylsis; downloaded Apr. 11, 2016.

https://en.wikipedia.org/wili/Tomography downloaded Apr. 11, 2016.

Rocketh Group, http://www.rockphysics.ethz.ch/ Imperial College Department of Earth Science and Engineering.

Digital Rocks Portal https://www.digitalrocksportal.org/ University of Texas.

* cited by examiner

COGNITIVE ENHANCED OIL RECOVERY ADVISOR SYSTEM BASED ON DIGITAL ROCK SIMULATOR

TECHNICAL FIELD

This invention relates generally to simulation methods and, more specifically, relates to optimal selection of Enhanced Oil Recovery (EOR) additives for a given reservoir rock sample.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Fluid-fluid and fluid-solid interactions in digital rock analysis (DRA) can be modeled in order to better predict enhanced oil recovery (EOR) efficiency and to support decision-making in oil recovery operations. One type of decision that can be made relates to selection of an additive to aid in the recovery of oil from a particular reservoir.

BRIEF SUMMARY

This section is intended to include examples and is not intended to be limiting.

An example embodiment is provided as a method including calculating a first property vector indicative of at least one physical property derived from a digital image of a first porous rock sample; determining a set of one or more similar porous rock samples by calculating a value indicating a similarity between the first porous rock sample and each of one or more second porous rock samples based on the first property vector and one or more second property vectors associated with the one or more second porous rock samples; selecting a list of one or more fluid additives based on existing enhanced fluid recovery efficiency values associated with the one or more similar porous rock samples; performing, for each of the fluid additives, a simulation of a flow of fluid through a digital model of the first porous rock to determine a simulated enhanced fluid recovery efficiency value for the respective fluid additives; and outputting an optimal fluid additive for the first porous rock sample based at least in part on the calculated similarity values and the simulated enhanced fluid recovery efficiency values.

In another example embodiment an apparatus is provided, including at least one processor; and at least one memory including computer program code, the at least one memory and the computer program code configured to, with the at least one processor, cause the apparatus to at least: calculate a first property vector indicative of at least one physical property derived from a digital image of a first porous rock sample; determine a set of one or more similar porous rock samples by calculating a value indicating a similarity between the first porous rock sample and each of one or more second porous rock samples based on the first property vector and one or more second property vectors associated with the one or more second porous rock samples; select a list of one or more fluid additives based on existing enhanced fluid recovery efficiency values associated with the one or more similar porous rock samples; perform, for each of the fluid additives, a simulation of a flow of fluid through a digital model of the first porous rock to determine a simulated enhanced fluid recovery efficiency value for the respective fluid additives; and output an optimal fluid additive for the first porous rock sample based at least in part on the calculated similarity values and the simulated enhanced fluid recovery efficiency values.

In another example embodiment, a computer program product for capillary network simulations, the computer program product comprising a computer readable storage medium having program instructions embodied therewith, the program instructions executable by a device to cause the device to: calculate a first property vector indicative of at least one physical property derived from a digital image of a first porous rock sample; determine a set of one or more similar porous rock samples by calculating a value indicating a similarity between the first porous rock sample and each of one or more second porous rock samples based on the first property vector and one or more second property vectors associated with the one or more second porous rock samples; select a list of one or more fluid additives based on existing enhanced fluid recovery efficiency values associated with the one or more similar porous rock samples; perform, for each of the fluid additives, a simulation of a flow of fluid through a digital model of the first porous rock to determine a simulated enhanced fluid recovery efficiency value for the respective fluid additives; and output an optimal fluid additive for the first porous rock sample based at least in part on the calculated similarity values and the simulated enhanced fluid recovery efficiency values.

DETAILED DESCRIPTION OF THE DRAWINGS

An alphabetically arranged list of abbreviations and associated definitions that occur in the description of the invention is provided below for the convenience of the reader.

DHD direct hydrodynamic
DPD dissipative particle dynamics
DRA digital rock analysis
EOR enhanced oil recovery
FDM finite difference method
FEM finite element method
FVM finite volume method
LBM lattice boltzmann method
MD molecular dynamics
MPS multi-point statistics
MSPS multiscale percolation system
REV representative elementary model SPH smoothed particle hydrodynamics As employed herein a voxel can be considered as a 'volume pixel' that is one element of an array of elements of volume.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

There has been a trend in modeling to reduce voxel size, in conjunction with improvements in tomographic imaging techniques, to aid a researcher in exploring the nanostructure of pore networks. This can create a demand for a novel DRA approach that takes into account micrometer scale and nanometer scale fluid-fluid and fluid-solid interactions. In general, the larger the surface-to-volume ratio of the pore channels in a porous medium, the more important are the interactions on the overall flow properties in the porous medium.

One conventional approach to DRA and its implementations focuses solely on the geometrical and morphological aspects of a rock structure and the pore network within it, as obtained by tomographic imaging. Image processing and image enhancing algorithms can be used to remove noise, calculate pixel statistics and perform binary segmentation. Morphological algorithms extract properties such as the medial axis skeleton and the connectivity of the pore network. This information is then used to perform fluid flow simulations (geometry) and pore network models (morphology) in order to obtain the transport properties of fluids through that porous medium.

Accounting for the fluid-fluid and fluid-solid interactions and how they change when recovery enhancers are added to the system allows for a more accurate physical description of the flow in porous media and enables the realization of simulated trials to determine which recovery enhancement approach provides the optimum EOR efficiency.

Currently, there are a number of systems that may be used to support the screening of EOR additives, however, each of these systems are limited in one more of the following ways: lack a combination of physics-based simulations and experiments with artificial intelligence in the advisory process; do not allow the user to include additional axioms (inductive or deductive) in the advisory process; lack AI for shortlisting potential candidates; lack flow simulations at the micro-/nanoscale based on Digital Rock Simulation technology; lack experimental tests to further evaluate the efficiency of the initial screening; and lack a knowledge-base of Digital Rock analysis.

The exemplary embodiments described herein provide techniques for cognitive enhanced oil recovery (EOR) based on a digital rock simulator. Generally, the techniques relate to an EOR advisor system that combines inductive (e.g. machine learning) and deductive (e.g. physical measurements and computer simulations) reasoning for selecting an optimal EOR additive for a given oil reservoir rock.

Figure 1:
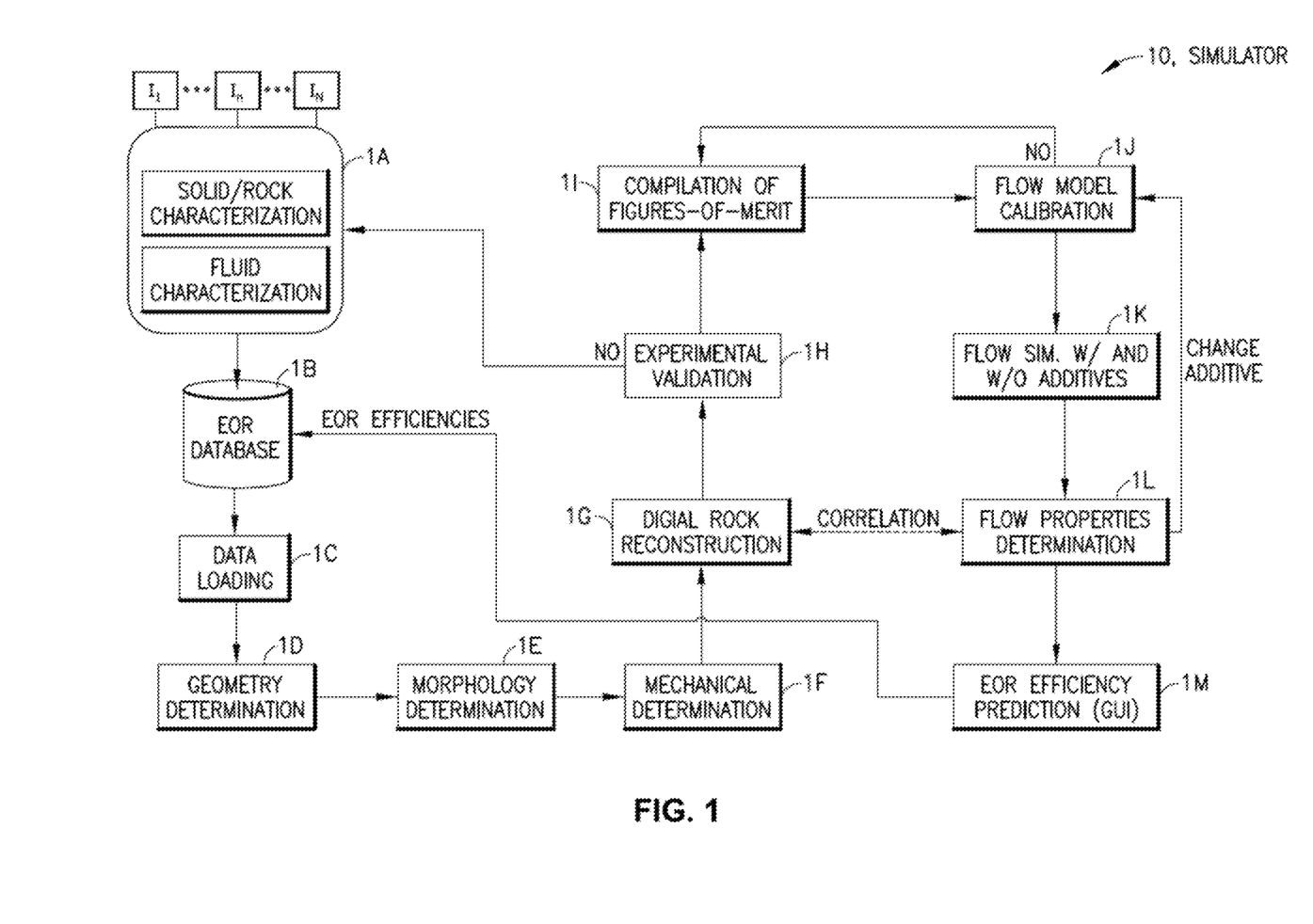
FIG. 1 is an example simulator and simulation workflow.

Referring now to FIG. 1, this figures shows an example of a digital rock simulator 10 and simulation workflow.

The blocks $I_1$, $I_n$, $I_N$ are representative of various data sources. The simulation workflow begins by populating an EOR database 1B from block 1A with physical characterizations of fluids and solids (rocks and dispersed particles). Block 1A receives the outputs of the $I_1$, $I_n$, $I_N$ and supplies these as the physical characterizations of fluids and solids to the EOR database 1B. These physical characterizations can include but are not limited to material data and flow properties data. This data may originate from the array of sources $\{I_n\}$ such as sensors, experimental tools, ab initio simulations, phenomenology and/or libraries. Rock characterization input data to the EOR database 1B provides at least geometrical information on a pore network of interest while the solid characterization input data to the EOR database 1B provides physical information regarding, for example, the wetting, chemistry, material, mechanical, spectroscopical, etc., properties of the solids involved in the simulation (rocks or suspended particles). Fluid characterization input data to the EOR database 1B can be represented as a list of fluid properties such as, but not limited to, density, viscosity, surface tension, line tension, molecular composition, structural factors and/or compressibility. The EOR database 1B is then loaded into the simulator 10 by data loading block 1C and consumed by the simulator 10 in order to begin processing the stored information. The rock characterization input of block 1A may arise from various experimental and/or simulated sources. A three dimensional (3D) tomographic image, either obtained experimentally or generated numerically from a set of two dimensional (2D) images, can be read by the simulator 10. The 3D tomographic image is comprised of a collection of voxels (volume pixels), each representing a region of the sample of interest at a certain length scale. The voxel size (resolution) determines the scale at which the physics of the fluid-solid interaction should be captured by the simulator 10.

Experimental techniques such as, but not limited to, X-ray computed micro-tomography/nano-tomography, synchrotron computed micro-tomography/nano-tomography, dual-energy computed micro-tomography/nano-tomography, focused ion beam tomography, electron tomography, 3D atom probe, etc., may be used to measure the rock structure and to store the structural geometry in a data file. In computerized tomography the voxels typically hold a gray-scale integer value (from 0 to 255 in 8-bit notation or 0 to 65535 in 16-bit notation) that is representative of the density and atomic number of the sample at that point. Denser regions are associated with the rock itself while lighter regions are associated with the pore space within the rock. Certain numerical techniques, such as the MPS or the MSPS, can also be used to create 3D pseudo-cores suitable for use in the simulator 10 from a set of 2D images. Techniques for accomplishing this are described in, for example, Zhang et al., U.S. Pat. No. 8,725,477 B2, Hurley et al., U.S. Pat. No. 8,908,925 B2 and Hurley et al., US 20120221306 A1, as well as in Daïan et al., Journal of Petroleum Science and Engineering 42 (2004) 15-28, Fernandes et al., Physical Review E 54, 1734 (1996) and Liang et al., Journal of Petroleum Science and Engineering 21, Issues 3-4, November 1998, Pages 273-283. Such 2D images can be obtained from experimental techniques such as scanning electron microscopy, scanning probe microscopy, atomic force microscopy and laser scanning fluorescence microscopy. In addition, rock input data can be loaded from a library that may be proprietary or open, such as ROCKETH Group, http://www.rockphysics.ethz.ch/, Imperial College Department of Earth Science and Engineering, and/or Digital Rock Portal @ University of Texas.

The solid characterization input of block 1A conveys additional physical information such as chemistry, material, mechanics, spectroscopy, etc., other than the purely geometrical information that can be assigned to the solid voxels in order to augment the physical meaning attributed to them.

The operation of the simulator 10 can be enhanced by assigning additional information to the voxels such as, but not limited to, chemical composition, molecular termination, free energy, surface charge and philicity or phobicity towards a certain fluid. The solid characterization can be assumed to include as well the characterization of any solid particles that are to be dispersed in the embedding fluids.

The additional physical information of the solid characterization input is preferably representative of the solid properties at the same scale (voxel) as the geometric detail of the rock characterization input of block 1A is provided. Alternatively, if only information from a different scale is present, the required voxel-scale analog can be complemented by interpolation, extrapolation or by additional assumptions and calculations. The possible sources of the additional physical information are many and typically are ultimately defined by the length scale corresponding to the voxel size.

For nanometer-sized voxels it is possible to use either experimental nanoscience techniques (such as scanning probe or electron microscopy, hyperspectral imaging, confocal laser scanning microscopy, etc.) or atomic-scale or molecular-scale computer simulations (such as atomistic molecular dynamics, coarse-grained molecular dynamics, Monte Carlo, etc.) For micrometer-sized voxels it is possible to use experimental mesoscale techniques (such as profilometry, petrography, optical microscopy, mercury porosimetry, etc.) or mesoscale numerical techniques (such as the LBM, dissipative particle dynamics, smoothed particle dynamics, etc.) as is deemed most appropriate. For example, the LBM (or thermal lattice boltzmann methods (TLBM)) form a class of computational fluid dynamics methods for fluid simulation. Instead of solving Navier-Stokes equations, the discrete Boltzmann equation is solved to simulate the flow of a Newtonian fluid with collision models such as Bhatnagar-Gross-Krook (BGK). By simulating streaming and collision processes across a limited number of particles, the intrinsic particle interactions evince a microcosm of viscous flow behavior applicable across the greater mass.

Alternatively, and for any length scale of interest, it is possible to resort to libraries and published results in the literature to populate the EOR database 1B with the physical properties required as inputs to the simulator 10. In addition, in a case where such additional information is not available an ad hoc value for the required physical property can be assigned to the voxels by the user.

After loading the EOR database 1B the process flow continues to execute blocks 1D, 1E, 1F and 1G of the simulator 10 where the geometrical, morphological and mechanical properties of the rock can be determined by the application of a series of computational algorithms. These processes use both the preloaded and calculated information to enable the digital reconstruction of the rock sample, and its visualization, in a computational environment.

The rock sample geometry determination of block 1D may involve image processing algorithms such as, but not limited to, noise-removal filters, image segmentation, image labeling and pixel statistics as well as 3D visualization of the geometry. The geometry determination of block 1D may also employ data from the solid characterization input of block 1A by correlating, for example, spectroscopy data (material) and tomography data (grayscale level) in order to enhance image segmentation algorithms. One goal of the geometry determination of block 1D is to segment the sample image into first voxels corresponding to "rock" and second voxels corresponding to "pores". A binary segmentation process can be employed in this regard.

Several morphological properties of the pore structure may be calculated during the operation of the morphology determination block 1E. The morphological properties that can be determined by the operation of block 1E in order to better characterize the rock geometry can include, but are not limited to, one or more of surface boundary, surface-to-volume ratio, porosity, pore size distribution, connectivity of the pore network, fractal dimensions of both the connected pore network and its surface, radius of gyration, moment of inertia, two-point correlation function, autocorrelation and autocovariance.

The mechanical determination of block 1F can include the calculation of the mechanical and seismic properties of the rock such as, but not limited to, shear and bulk moduli, formation factor, elasticity, compressional velocity, shear velocity and electrical resistivity, which can also benefit seismic modeling simulators. Significantly, the mechanical determination process of block 1F may also apply reservoir-like conditions of pressure and temperature to deform the rock structure towards its reality in the oil field. As a result the input to the flow simulation can be even more representative of the actual, real rock sample.

The end result of the operations of blocks 1D-1E can be a digital rock reconstruction visualization process performed by block 1G.

Once the digital rock reconstruction processes are completed the result can be validated against known experimental results by the experimental validation block 1H. The experimental validation process of block 1H can include, as non-limiting examples, a comparison of porosity, density, bulk and shear moduli and sound wave speeds to known experimental results.

For example, if the computed porosity of the digital rock sample does not match an experimentally determined porosity that was obtained by mercury porosimetry experiments one may be required to redo the micro-tomography using better spatial resolution and/or signal-to-noise ratios. Conversely, if the computed density does not match the experimental value one may need to recompile the list of constituent minerals and perform multi-level image segmentation to account for different mineral (solid) phases. As such, an iterative path (the No branch from block 1H) can be established and, at each iteration loop, the EOR database 1B can be augmented with additional, improved information that ultimately leads to an acceptable digital rock reconstruction at block 1G that terminates the iterative loop.

After the accuracy checks have been performed and the digital rock reconstruction has been experimentally validated at block 1H, control passes to block 1I where a list of target figures-of-merit is compiled, both for the solid (rock) and fluid physical properties. The values of such properties may, preferentially, be provided either by experiments or by ab initio atomic-scale/molecular-scale calculations, where the property values are preferably sensitive to nanoscale phenomena. An exemplary and non-exhaustive list of target nanoscale-aware figures-of-merit may include one or more of: (a) contact angles or appropriate measures of the rock's wettability with respect to one or more fluids; (b) fluid properties such as, but not limited to, density, viscosity, surface tension, line tension and compressibility; and (c) permeability with respect to single-phase and two-phase flow of simple fluids such as water and/or oil.

Relatedly, a concept of "full-sample dimensions" pertains to a length scale at which the figures-of-merit are defined. The figures-of-merit can be defined at a length scale that corresponds to the entire digital rock sample (for example, a computed micro-tomography scan), hence "full-sample dimensions". Note, however, that certain properties such as, for example, permeability cannot be defined at sub-micron scales. The figures-of-merit, although defined for "full-sample dimensions", can be highly sensitive to nanoscale phenomena, and it is in this sense that the model can be calibrated. In this case then it is desirable to tune the nanoscale interactions and observe their effect upon larger length scale properties such as, for example, the permeability of the entire porous rock sample.

After the list of figures-of-merit is compiled at block 1I the operation of the simulator 10 progresses to blocks 1J, 1K and 1L. It can be noted that recursions are possible between certain of these blocks, in particular between the flow model calibration block 1J and the figures-of-merit compilation block 1I, and between the flow properties determination block 1L and the flow model calibration block 1J (the line labeled "change additive").

Basically the portion of the simulator 10 represented by the blocks 1J, 1K and 1L involves the use of computational fluid dynamics algorithms such as, but not limited to, physics-based flow models including, for example, (coarse-grained) MD, DPD, LBM, SPH, FVM, FEM and/or FDM. Phenomenological methods can also be employed such as an electrical-analog pore network model. The geometrical and morphological data derived in blocks 1D, 1E (and 1F) may also be used as input to the fluid dynamics simulations. An appropriate mesh, lattice, network or another suitable (computational) spatial representation of the rock is created and local physical properties are assigned.

Regardless of the selected flow model, the flow model calibration block 1J is operated to tune the (often unphysical) flow model parameters so that the nanoscale-aware figures-of-merit determined and enumerated at block 1I are matched as closely as possible. As was noted above, one exemplary figure-of-merit might be, for example, the water-oil contact angle on a given surface. In this non-limiting case:

in LBM it may be desirable to tune the constants of multi-phase Shan-Chen or Free-Energy models (e.g., Huang et al., Physical Review E 76, 066701 (2007); Schmieschek et al., Communications in Computational Physics 9 (2011), 1165-1178);

in SPH it may be desirable to tune the particle-particle force parameters (e.g., Tartakovsky et al., Physical Review E 72, 026301 (2005); Das et al., Chemical Engineering Science 65, Issue 13, July 2010, Pages 4027-4037; Liu et al., International Journal of Computational Methods 08, 637 (2011)); while in DPD it may be desirable to tune the strength of the attraction and repulsive force terms (e.g., Liu et al., International Journal of Computational Methods 08, 637 (2011); Henrich et al., Europhysics Letters 80, 60004 (2007); Lin et al., Interaction and Multiscale Mechanics, Vol. 5, No. 4 (2012) 399-405).

Note that certain additives such as, but not limited to, chemicals, polymers, nanoparticles, emulsions and gas bubbles can have an effect of changing the contact angle of an oil droplet on the rock surface thereby leading to a lower wettability and a higher oil recovery rate. Such a modification to the figure-of-merit (contact angle) is also preferably captured by the flow model calibration block 1J.

When all of the model parameters are calibrated with respect to their respective target figures-of-merit, the flow model is ready to provide predictive results. The iterative loop represented by the change additive arrow between the flow properties determination block 1L and the flow model calibration block 1J can be implemented simply by taking available candidate additives from a predefined list of additives, or by using an additive design methodology that tailors and optimizes the additive to maximize EOR efficiency.

The flow simulation with (and without) additives block 1K employs one or more computational fluid dynamics simulation methods in order to obtain the expected fluid transport properties of the rock sample of interest. A final goal of this process is the determination of flow properties at block 1L. The flow properties can contain three-dimensional fields (scalar, vector or tensor) representing spatially-dependent physical data in the rock sample such as, but not limited to, flow velocity, pressure and density, as well as overall physical properties (scalar, vector or tensor) that quantitatively characterize the fluid flow and the oil recovery in the porous rock sample such as, but not limited to, absolute and relative permeability tensors, oil sweep efficiency and capillary pressure.

The arrow labeled "correlation" between the digital rock reconstruction visualization process of block 1G and the flow properties determination process of block 1L indicates an ability to verify that the determined flow properties are compatible with the previously determined geometrical, morphological and mechanical properties of the rock.

The EOR efficiency prediction block 1M can be implemented as a visualization process using a GUI. This process of the simulator 10 enables a quantification to be made of the effect of an additive or additives on the flow properties. Once all candidate additives have been tested, their EOR efficiency with respect to, for example, a simple water-flooding (without additives) and to one another can be quantified and ranked, allowing for the selection of the best candidate EOR approach, while considering also, for example, cost-effectiveness criteria.

An output from the EOR efficiency prediction block 1M, representing a result of the simulation workflow including EOR efficiencies for each tested additive and other information, can be fed back to the EOR database 1B. By augmenting the EOR database 1B with the information descriptive of EOR efficiency it becomes possible to build a knowledge base that can be later accessed by, as one non-limiting example, a cognitive processing system for providing insights into EOR strategies, such as the advisory system 11 described in further detail below with reference to FIG. 2. The EOR database 1B can contain, for example, both structured and unstructured data related to the inputs and outputs of all system processes, as well as external information (with respect to the system) that can, however, be correlated to the system data. Non-limiting examples of such data can include bulk scalar (porosity), vector (average flow velocity vector) or tensor (permeability) variables, spatially-dependent scalar (density), vector (flow velocity) or tensor (stiffness) fields as well as images (graphs), texts (reports) and various tables of interest (e.g., cost of additives).

Figure 2:
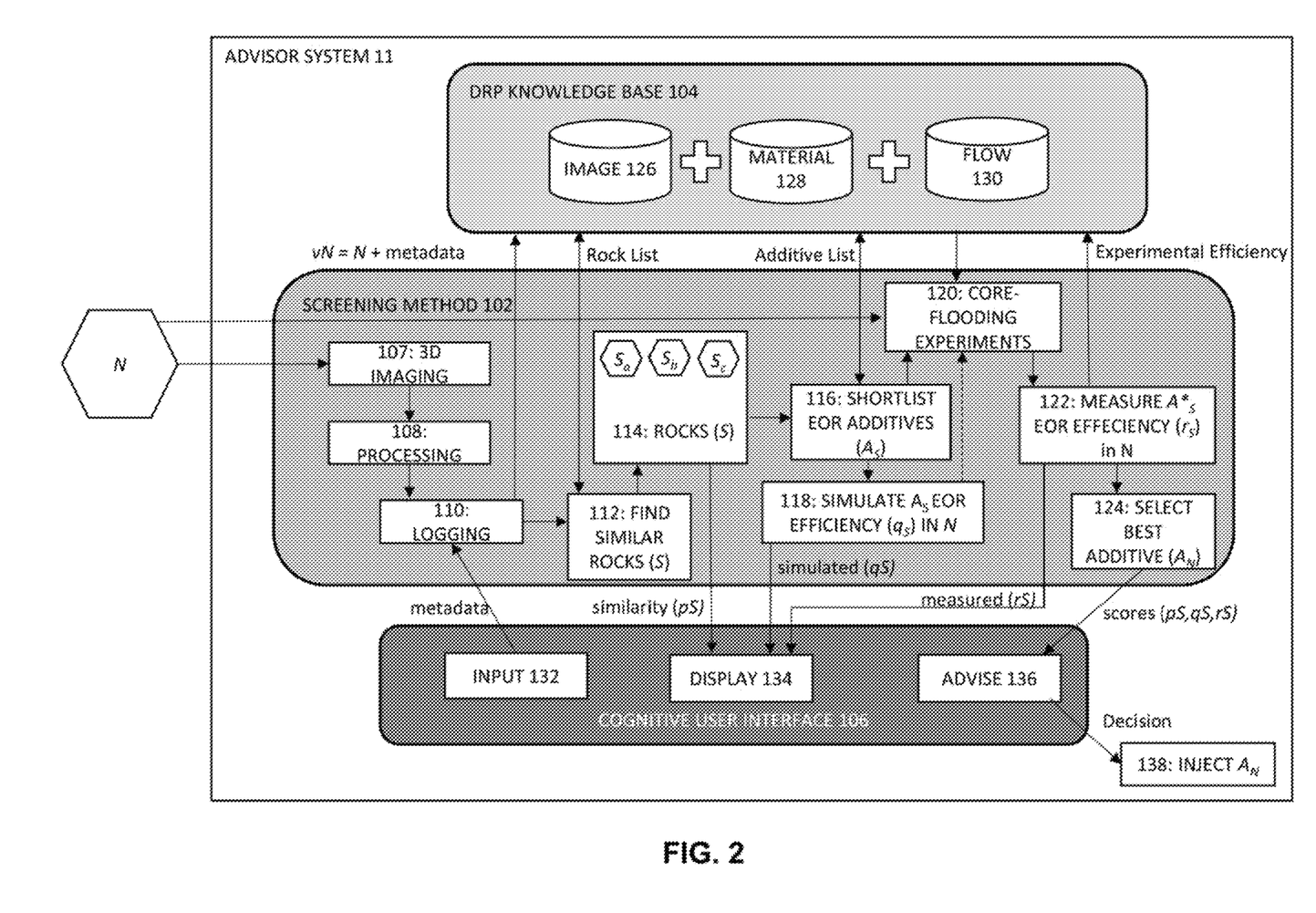
FIG. 2 is a non-limiting example of an advisor system and workflow in accordance with exemplary embodiments.

Referring now to FIG. 2, this figure shows a non-limiting example of an EOR advisor system 11 and workflow in accordance with example embodiments. The advisor system 11 is based at least partially upon the simulator 10 shown in FIG. 1. In this way, at least some of the parts from the process flow of FIG. 1 may correspond to, or overlap, with the process flow of FIG. 2 as will be discussed in more detail below.

Generally, the advisor system 11 may include a DRP knowledge base (KB) 104 that stores data related to rock samples and their flow properties, including material information on the mineralogy, the flowing fluids and EOR additives that have been tested. In some examples, the DRP KB 104 may include at least in part the EOR database 1B from FIG. 1. At each use the DRP KB 104 ingests data from physical measurements so that the DRP KB 104 becomes more comprehensive the more it is used. The advisor system 11 also includes a cognitive user interface 106 that handles input/output operations and user feedback in the form of text, tables, images and/or sound. The cognitive user interface 106 allows the user to add new metadata and axioms to help the screening process and well as track the intermediate steps of the screening methodology. At the end of execution the cognitive user interface 106 may convey the final decision to the user in the form of an action or a suggestion of an action to be performed by the user. For example, along with a suggestion of the optimal additive, scores from the screening process for all of the additives that were considered in the screening process and for which a final score was obtained may also be displayed. The advisor system 11 may also include a multi-step physical/digital process for screening EOR additives for new porous rock samples through a combination of inductive and deductive reasoning schemes. This process is represented by the screening method block 102 in FIG. 2. The screening method 102, the DRP KB 104, and the cognitive user interface 106 are each discussed in more detail below.

EOR Screening Method

The screening method 102 of advisor system 11 begins by performing a physical measurement on a new rock. The new rock includes a core sample, N, of an oil reservoir rock that is loaded, for the first time, into the advisor system 11.

At block 107, 3D imaging is performed on the core sample, N. As will be appreciated, block 107 may, for example, generally correspond to block 1A of FIG. 1. For example, the 3D imaging in block 107 may include using x-ray, electron beam or any other suitable means for obtaining a three-dimensional image of the region-of-interest of N, such as nano-/micro-tomography or FIB-SEM. Block 107 may also include loading the sample N, sub-sampling a region-of-interest of sample N, and positioning the sample N, prior to imaging.

At block 108, processing is performed based on the 3D imaging data from block 107. The processing performed in block 108 may, for example, generally correspond to blocks 1D, 1E, and 1F of FIG. 1. For example, such processing may involve image-processing algorithms suitable for extracting derived physical properties from the 3D image such as porosity, tortuosity, surface-to-volume ratio, pore-size distribution, etc. At step 110, the 3D image and the associated metadata is logged, e.g., by uploading the image and associated metadata to the DRP KB 104. For example, the logging may include compiling the 3D image and the associated metadata into a property vector $v_N$ that uniquely identifies N and uploading it to the DRP KB 104. In an example embodiment, the processing block may leverage blocks 1D-1F from the simulator 10 in this regard.

At block 112, one or more rocks having similar properties as the core sample N are found, for example, by querying the DRP KB 104 and retrieving a list of previously loaded rocks. The list of similar rocks may be represented by respective vectors ($v_S$). This rock list may then be used as input for an algorithm that selects those rock in the list that are most similar to N. The selection can take into account the 3D image and its derived physical properties (porosity, tortuosity, pore size distribution, etc.) but also user-provided metadata (GPS coordinate of extraction, source reservoir, rock type, etc.). Some non-limiting example algorithms that may be used to select the similar rocks include k-means, Principal Component Analysis, Neural Network and other Machine Learning and Data-Clustering methods.

At block 114, a set of one or more similar rocks is found, which is denoted as S. In the example in FIG. 2, the set S includes $S_a$, $S_b$, and $S_c$. Each rock in the set S may be represented by a vector, $v_S$, with a similar format as $v_N$ for example. In this way, each vector may comprise 3D images and metadata on the set of rocks identified as being similar to N. The 3D images, metadata and calculated similarity ($p_S$) may be displayed by display block 134 of the cognitive UI 106.

At block 116, a query is made based on the set S of similar rocks to the DRP KB 104 to obtain a list of additives, which includes previously loaded additives ($A_S$) together with their EOR efficiency for the similar rocks in set S. The additives that worked best for the rocks in set S are then selected from the list of additives to obtain a shortlist of EOR additives ($A_S$). Inductive reasoning may also be used to retrieve additional candidate additives from the DRP KB 104 by passing $v_N$ as input to, in some non-limiting example, algorithms such as k-means, Principal Component Analysis, Neural Network and other Machine Learning and Data-Clustering.

At block 118, EOR efficiency is simulated for the shortlist of additives, $A_S$, in N. For example, block 118 may include at least the processes described by blocks 1G-1H-1I-1J-1K-1L (excluding the "No" branch at 1H); although in some examples block 118 may include further blocks from FIG. 1 such as one or more of blocks 1A to 1F. In particular, the simulator may perform computer simulations of oil displacement through N to assess the EOR efficiency of each candidate additive in $A_S$. A measure of the EOR efficiency may include, for example, relative permeability, velocity and pressure fields, sweep efficiency, oil left in place, and recovery percentage for example. The simulator may output a simulated EOR efficiency ($q_S$) which may be displayed utilizing display block 134 of the cognitive UI 106.

At block 120, core-flooding experiments are performed including physical measurements on rock N for testing the EOR efficiency of candidate additives $A_S$. Core-flooding refers to a test to measure permeability and investigate how fluids (oil, water, gas, etc.) flow through a test subject rock sample (e.g. as described in U.S. Pat. No. 8,356,510B2, U.S. Pat. No. 8,683,858B2 and U.S. Pat. No. 5,783,760A). Alternatively, the simulation results could be used to pre-select a subset $A^*_S$ of the original list $A_S$ having the highest relative simulated EOR efficiency values from the simulation of block 118 in order to both save time and costs associated with physical measurements and also to improve the efficiency of the overall process by saving processing resources for example. According to an example embodiment, the advisor system 11 may indicate which physical measurements should be performed in blocks 120 and/or 122, such as, but not limited to, drainage of a certain fluid, (forced) imbibition of a certain fluid, and displacing a first fluid (oil) by a second fluid (water).

In one example embodiment, performance of blocks 120 and 122 may be optional. For example, the process shown in FIG. 2 could proceed from block 118 directly to block 124.

At block 122, the EOR efficiency of the additives in subset $A^*_S$ are measured in N. For example, this may involve quantifying the EOR efficiency of $A^*_S$ in the core-flooding experiments. A measure of the EOR efficiency could be relative permeability, velocity and pressure fields, sweep efficiency, oil left in place, and recovery percentage, for example. The measured experimental EOR efficiency ($r_S$)

may be displayed by display 134 of the cognitive UI 106 and uploaded to the DRP KB 104.

At block 124, an optimal additive for rock N is selected, denoted by $A_N$. The selection of $A_N$ may include selecting from the $A^*_S$ subset the EOR additive ($A_N$) best suited for rock N based on the scores ($p_S$, $q_S$, $r_S$). In some examples, $A_N$ may be selected based on less than all three scores, such as being based on $r_S$ alone. The selection $A_N$ and its supporting information may advise the user using the cognitive UI 106 as shown at block 136.

DRP Knowledge Base

The DRP KB 104 in the example in FIG. 2 may include one or more databases for storing data related to, e.g, rock samples and their flow properties, such as material information on the mineralogy, the flowing fluids, and/or the EOR additives that have been tested. For example, the DRP KB 104 may include an image database 126, a material database 128, and a flow database 130. Although three separate databases 126, 128, 130 are shown in FIG. 2, this is not intended to be limiting as different a number of databases is all possible, e.g., all the information may be combined into a single database in different tables. The image database 126 may store 3D images at pore and sub-pore scales that have been obtained by techniques such as micro-/nanotomography (nano-/microCT) and focused ion beam scanning electron microscopy (FIB-SEM). For each sample image, a vector v is defined, that stores various sample properties and metadata such as porosity, tortuosity, surface-to-volume ratio, fractal dimension, pore size distribution, grain size distribution, grain orientation, mineralogy, chemical composition, GPS coordinates of extraction, date of extraction, rock type, and source reservoir, among others.

The material database 128 may store data related to all materials involved in the flow phenomena. For example, material database 128 may include data on the flowing fluids such as density, viscosity, wettability, compressibility, interfacial tension, line tension, equations of state, among others. The material database 128 may also include data on the EOR additives that were tested in conjunction with the flow fluids, such as their molecular composition, solubility with respect to the flowing fluids, degradation temperature, equations of state, mechanical stability, cost, among others.

The flow database 130 may store data related to the flow properties of those flowing fluids inside the related rocks, with and/or without EOR additives. In some examples, the flow database 130 may overlap with the EOR database 1B in FIG. 1. For instance, the flow database 130 may include similar data as described above for EOR database 1B. However, it is noted that this is not intended to be limiting, and EOR database 1B and flow database 130 may be different database instances, or even located in different servers. For example, the flow database 130 may include data such as velocity field distribution, pressure field distribution, partial pressure curves, sweeping curves, oil left in place, and sweep efficiency for example.

When the DRP KB 104 is queried by the screening method 102 at block 112, the DRP KB 104 may return the list of rock samples (e.g., as represented by their property vectors) so that the most similar ones can be drawn from the list. The DRP KB 104 may also return a list of EOR additives based on the query from block 116 of the screening method 102, which had their EOR efficiency quantified previously in the similar rock set S.

The DRP KB 104 stores, when queried by block 110, the identification vector of N ($v_N$) containing the physical properties and metadata associated with N, and also stores, when queried by block 122 of screening method 104, the EOR efficiency of additives as determined experimentally for rock N. This information augments and improves the DRP KB 104 for later usage.

Cognitive User Interface

The cognitive user interface 106 controls the input/output operations and user feedback in the form of text, tables, images and/or sound. The user interface 106 may be, for example, implemented similarly as described above for block 1M of FIG. 1, and in particular, at least the display component 134. However, the input module 132 and advise module 136 need not be fully contained within 1M. The input module 132 allows the user to provide metadata associated to N, such as GPS coordinates of extraction, date of extraction, source reservoir, rock type, etc. and all the physical properties not readily derived from the 3D image in the processing block 108 of screening method 102, such as mineralogy and chemical composition for example. This additional information, together with the 3D image, is used to create the identification vector $v_N$ that is uploaded to the DRS KB 104 by the logging block 110. The metadata also defines the metric with which the similarity p between two rock vectors u and v can be calculated, such as the generalized cosine for example. The display module 134 may include graphical, sound, tactile or any combination of such interactions to inform the user of the current state of the system. The display module 134 is responsible for displaying 3D images and metadata of the similar rock set (S) alongside the similarity ($p_S$) of each rock in the set as determined by the block 112 of the screening method 102. The display module 134 is also responsible for conveying, in the form of text, sound, tables or graphs, the simulated EOR efficiency ($q_S$) and the measured EOR efficiency ($r_S$) as determined by the respective blocks 118, 122 in screening method 102. The user can, therefore, take into account all three figures-of-merit in the decisions process.

The advise module 136 may include conveying the final decision to use the optimal additive $A_N$ (determined by block 124) as shown at 138 in FIG. 2. The advise module 136 may also cause display of supporting information, e.g. the scores ($p_S$, $q_S$, $r_S$), and provide advice in the form of an action performed by the advisor system 11 itself or in the form of a suggestion of what the user should do next.

Figure 3:
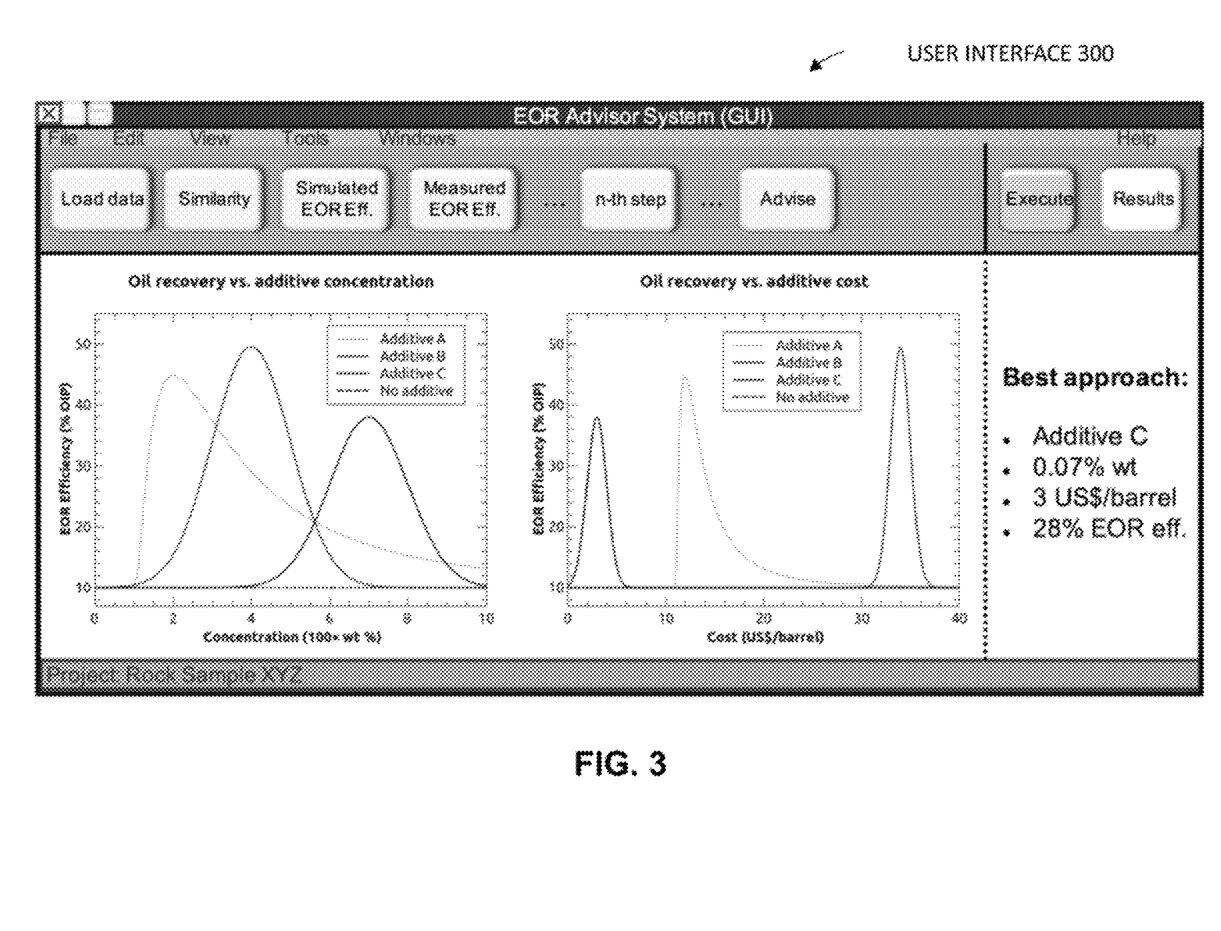
FIG. 3 an example of a graphical user interface presentation to a user of the advisor system shown in FIG. 2.

FIG. 3 shows an example screenshot of a graphical user interface 300 in accordance with example embodiments. The screenshot of the graphical user interface 300 corresponds to output from cognitive user interface 106 for three selected additives (A, B and C) and with no additive. In the illustrated example three additives (and no additive) are characterized for EOR efficiency vs. concentration and for EOR efficiency vs. cost and additive C is shown to provide the best approach.

Figure 4:
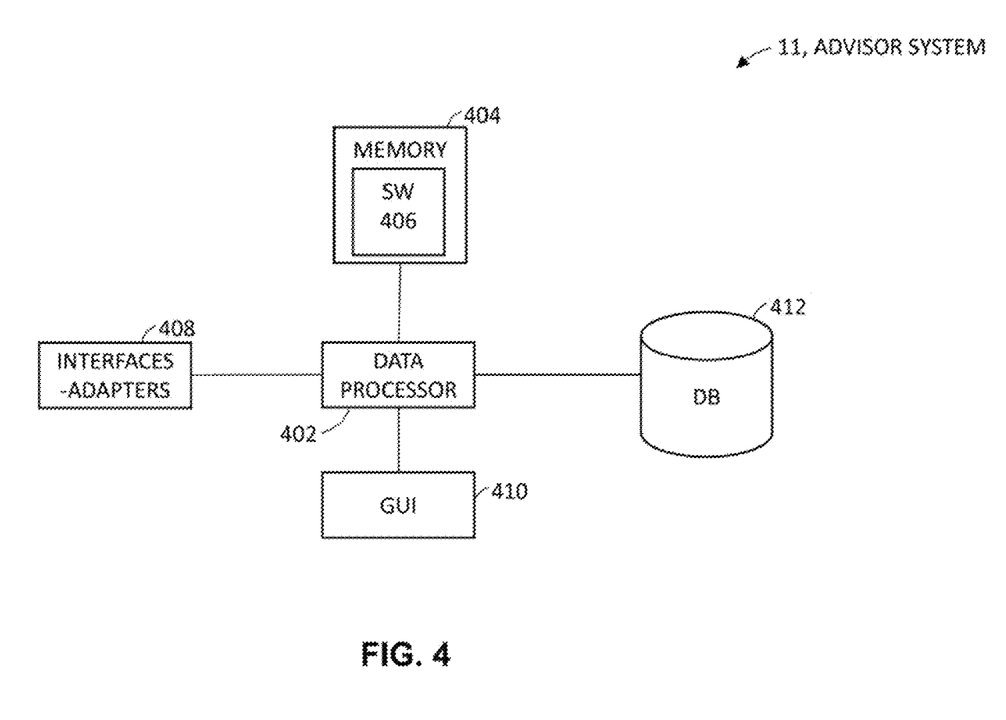
FIG. 4 is an example of a block diagram of the advisor system shown in FIG. 2.

FIG. 4 is an example of a high level block diagram of the advisor system 11 shown in FIG. 2. The advisor system 11 includes at least one controller/data processor 402 connected with at least one memory 404 that stores software (SW) 406, one or more interfaces/adapters 408, and may include or be connected to one or more user interface elements 410. The one or more memories 404 may comprise functionality as described herein and comprises computer-readable code that, when executed by the one or more processors 402, cause the advisor system 11 to perform the functionality described herein.

The advisor system may include or be connected to one more databases (DB) 412, such as the DRP KB 104 from FIG. 2, such as the image database 126, the material database 128, and the flow database 130, for example.

The data processor 402 may also be connected with interfaces/adapters 408 that are configured to receive data from various inputs, such as those inputs referred to in the 3D imaging block 107. For example, the data may include data from various sensors relating to measurements performed on the core sample, N. For example, the 3D imaging may include using x-ray and/or electron beams for obtaining 3D image data.

Also connected with the at least one controller/data processor 402 is at least one display device/GUI 410 that implements at least in part the various operations associated with the cognitive user interface 106.

In general the various components and sub-systems shown in FIG. 4 can be implemented in whole or in part as circuitry and/or as separate special purpose data processor/controllers and/or as the software 406.

The advisor system 11 can be physically instantiated in whole or in part as one or more computers and computing systems at an enterprise, such as at a natural resources exploration/recovery enterprise, or it could be, for example, instantiated at an agency or an academic institution, or it can be instantiated in whole or in part in a virtual manner in the cloud. In some embodiments the use of the advisor system 11 can be provided as a service to researchers and others via data communication networks including the Internet.

Figure 5:
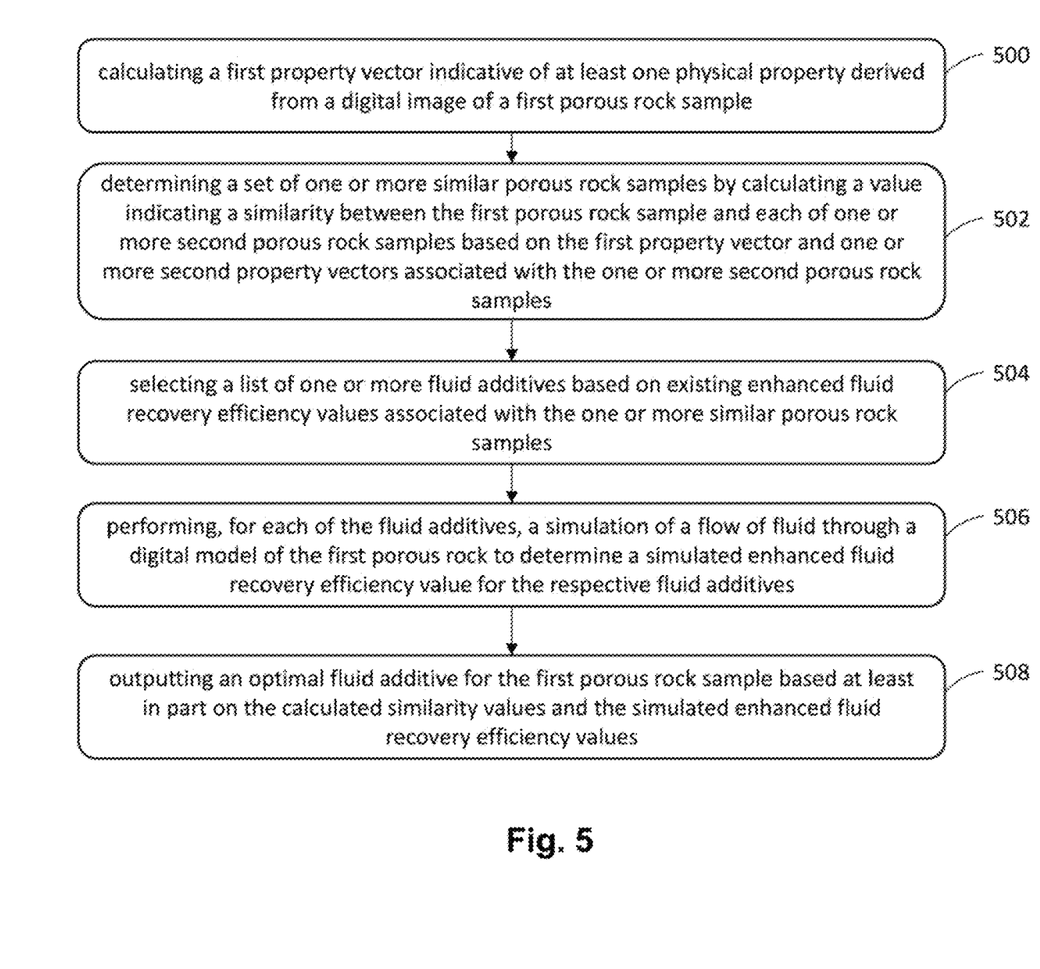
FIG. 5 is a logic flow diagram for cognitive enhanced oil recovery advisor system based on a digital rock simulator, and illustrates the operation of an exemplary method, a result of execution of computer program instructions embodied on a computer readable memory, functions performed by logic implemented in hardware, and/or interconnected means for performing functions in accordance with exemplary embodiments.

FIG. 5 is a logic flow diagram for cognitive enhanced oil recovery advisor system based on a digital rock simulator. FIG. 5 illustrates the operation of an exemplary method, a result of execution of computer program instructions embodied on a computer readable memory, functions performed by logic implemented in hardware, and/or interconnected means for performing functions in accordance with exemplary embodiments. It is assumed that an advisory system 11, such as advisory system of FIG. 4 for example, performs the blocks in FIG. 5.

Referring to FIG. 5, an example method may comprise calculating a first property vector indicative of at least one physical property derived from a digital image of a first porous rock sample as indicated by block 500; determining a set of one or more similar porous rock samples by calculating a value indicating a similarity between the first porous rock sample and each of one or more second porous rock samples based on the first property vector and one or more second property vectors associated with the one or more second porous rock samples as indicated by block 502; selecting a list of one or more fluid additives based on existing enhanced fluid recovery efficiency values associated with the one or more similar porous rock samples as indicated by block 504; performing, for each of the fluid additives, a simulation of a flow of fluid through a digital model of the first porous rock to determine a simulated enhanced fluid recovery efficiency value for the respective fluid additives as indicated by block 506; and outputting an optimal fluid additive for the first porous rock sample based at least in part on the calculated similarity values and the simulated enhanced fluid recovery efficiency values as indicated by block 508.

The method may further include receiving an input comprising physical measurement information for the first porous rock sample corresponding to at least one fluid additives in the list; and determining an experimental enhanced fluid recovery efficiency value for the at least one fluid additive based on the physical measurement information. Outputting the optimal fluid additive for the first porous rock sample may be further based on the experimental enhanced fluid recovery efficiency value. The experimental enhanced fluid recovery efficiency value and the simulated enhanced fluid recovery efficiency value may be based on one or more of: relative permeability, velocity and pressure fields, sweep efficiency, oil left in place, and recovery percentage. The method may further include recalculating the first property vector for the first porous rock sample using at least one of the experimental enhanced fluid recovery efficiency values or the simulated enhanced fluid recovery efficiency values; and uploading the recalculated first property vector to a database comprising the one or more second property vectors. The method may further include selecting a further list of fluid additives for performing a simulation of a flow of fluid through a digital model of a different porous rock sample, wherein the second list of additives may be selected based at least in part on the recalculated first property vector. The method may further include receiving a user input comprising at least one of: metadata information associated with the first porous rock sample; and physical property information corresponding to at least one further physical property not derived from the digital image, wherein calculating the first property vector is further based on the metadata information and/or the physical property information. The metadata information may include at least one of: global positioning system coordinates corresponding to an extraction locating of the first porous rock sample; a date of the extraction; a source reservoir of the first porous rock sample; and a rock type of the first porous rock sample, and the further physical properties may be at least one of: mineralogy information, and chemical composition information. The at least one physical property may include at least one of: a porosity, a tortuosity, a surface-to-volume ratio, and a pore-size distribution.

According to another embodiment, an apparatus (such as advisor system 11 from FIG. 4 for example) may include at least one processor; and at least one memory including computer program code, the at least one memory and the computer program code configured to, with the at least one processor, cause the apparatus to at least: calculate a first property vector indicative of at least one physical property derived from a digital image of a first porous rock sample; determine a set of one or more similar porous rock samples by calculating a value indicating a similarity between the first porous rock sample and each of one or more second porous rock samples based on the first property vector and one or more second property vectors associated with the one or more second porous rock samples; select a list of one or more fluid additives based on existing enhanced fluid recovery efficiency values associated with the one or more similar porous rock samples; perform, for each of the fluid additives, a simulation of a flow of fluid through a digital model of the first porous rock to determine a simulated enhanced fluid recovery efficiency value for the respective fluid additives; and output an optimal fluid additive for the first porous rock sample based at least in part on the calculated similarity values and the simulated enhanced fluid recovery efficiency values.

The at least one memory and the computer program code may be configured to, with the at least one processor, cause the apparatus to: receive an input comprising physical measurement information for the first porous rock sample corresponding to at least one fluid additives in the list; and determine an experimental enhanced fluid recovery efficiency value for the at least one fluid additive based on the physical measurement information. The output of the optimal fluid additive for the first porous rock sample is further based on the experimental enhanced fluid recovery efficiency value. The experimental enhanced fluid recovery efficiency value and the simulated enhanced fluid recovery efficiency value may be based on one or more of: relative permeability, velocity and pressure fields, sweep efficiency, oil left in place, and recovery percentage. The at least one memory and the computer program code may be configured to, with the at least one processor, cause the apparatus to: recalculate the first property vector for the first porous rock sample using at least one of the experimental enhanced fluid recovery efficiency values or the simulated enhanced fluid recovery efficiency values; and upload the recalculated first property vector to a database comprising the one or more second property vectors. The at least one memory and the computer program code may be configured to, with the at least one processor, cause the apparatus to: select a further list of fluid additives for performing a simulation of a flow of fluid through a digital model of a different porous rock sample, wherein the second list of additives is selected based at least in part on the recalculated first property vector.

The at least one memory and the computer program code may be configured to, with the at least one processor, cause the apparatus to receive a user input comprising at least one of: metadata information associated with the first porous rock sample; and physical property information corresponding to at least one further physical property not derived from the digital image, wherein calculating the first property vector may be further based on the metadata information and/or the physical property information. The metadata information may include at least one of: global positioning system coordinates corresponding to an extraction locating of the first porous rock sample; a date of the extraction; a source reservoir of the first porous rock sample; and a rock type of the first porous rock sample, and the further physical properties may include at least one of: mineralogy information, and chemical composition information. The at least one physical property may include at least one of: a porosity, a tortuosity, a surface-to-volume ratio, and a pore-size distribution.

According to another example embodiment, a computer program product for cognitive enhanced oil recovery is provided, the computer program product may include a computer readable storage medium (such as memory 404 from FIG. 5, for example) having program instructions embodied therewith, the program instructions executable by a device to cause the device to: calculating a first property vector indicative of at least one physical property derived from a digital image of a first porous rock sample; determining a set of one or more similar porous rock samples by calculating a value indicating a similarity between the first porous rock sample and each of one or more second porous rock samples based on the first property vector and one or more second property vectors associated with the one or more second porous rock samples; selecting a list of one or more fluid additives based on existing enhanced fluid recovery efficiency values associated with the one or more similar porous rock samples; performing, for each of the fluid additives, a simulation of a flow of fluid through a digital model of the first porous rock to determine a simulated enhanced fluid recovery efficiency value for the respective fluid additives; and outputting an optimal fluid additive for the first porous rock sample based at least in part on the calculated similarity values and the simulated enhanced fluid recovery efficiency values.

The program instructions may further cause the device to: receive an input comprising physical measurement information for the first porous rock sample corresponding to at least one fluid additives in the list; and determine an experimental enhanced fluid recovery efficiency value for the at least one fluid additive based on the physical measurement information.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method, comprising:
calculating a first property vector indicative of at least one physical property derived from a digital image of a first porous rock sample;
determining a set of one or more similar porous rock samples by calculating a value indicating a similarity between the first porous rock sample and each of one or more second porous rock samples based on the first property vector and one or more second property vectors associated with the one or more second porous rock samples;
selecting a list of one or more fluid additives based on a comparison of existing enhanced fluid recovery efficiency values associated with the efficiency of the one or more fluid additives used with the one or more similar porous rock samples;
performing, for each of the selected one or more fluid additives, a simulation of a flow of fluid through a digital model of the first porous rock sample to determine a simulated enhanced fluid recovery efficiency value for each of the respective one or more fluid additives when used with the first porous rock sample; and
outputting an optimal fluid additive for the first porous rock sample based at least in part on a combination of a comparison of the calculated similarity values, and a comparison of the simulated enhanced fluid recovery efficiency values.

2. The method of claim 1, further comprising:
receiving an input comprising physical measurement information for the first porous rock sample corresponding to at least one fluid additives in the list; and
determining an experimental enhanced fluid recovery efficiency value for the at least one fluid additive based on the physical measurement information.

3. The method of claim 2, wherein outputting the optimal fluid additive for the first porous rock sample is further based on the experimental enhanced fluid recovery efficiency value.

4. The method of claim 2, wherein the experimental enhanced fluid recovery efficiency value and the simulated enhanced fluid recovery efficiency value are based on one or more of:
relative permeability, velocity and pressure fields, sweep efficiency, oil left in place, and recovery percentage.

5. The method of claim 2, further comprising:
recalculating the first property vector for the first porous rock sample using at least one of the experimental enhanced fluid recovery efficiency values or the simulated enhanced fluid recovery efficiency values; and
uploading the recalculated first property vector to a database comprising the one or more second property vectors.

6. The method of claim 5, further comprising selecting a further list of fluid additives for performing a simulation of a flow of fluid through a digital model of a different porous rock sample, wherein the second list of additives is selected based at least in part on the recalculated first property vector.

7. The method of claim 1, further comprising receiving a user input via an input of a user interface of a fluid additive advisor system comprising at least one of:
metadata information associated with the first porous rock sample; and physical property information of the first porous rock sample corresponding to at least one further physical property of the first porous rock sample not derived from the digital image,
wherein calculating the first property vector is further based on the metadata information and/or the physical property information of the first porous rock sample.

8. The method of claim 7, wherein:
the metadata information comprises at least one of: global positioning system coordinates corresponding to an extraction locating of the first porous rock sample; a date of the extraction; a source reservoir of the first porous rock sample; and a rock type of the first porous rock sample, and
the further physical properties comprise at least one of: mineralogy information, and chemical composition information.

9. The method of claim 1, wherein the at least one physical property comprises at least one of: a porosity, a tortuosity, a surface-to-volume ratio, and a pore-size distribution.

10. An apparatus, comprising at least one processor; and at least one memory including computer program code, the at least one memory and the computer program code configured to, with the at least one processor, cause the apparatus to at least:
calculate a first property vector indicative of at least one physical property derived from a digital image of a first porous rock sample;
determine a set of one or more similar porous rock samples by calculating a value indicating a similarity between the first porous rock sample and each of one or more second porous rock samples based on the first property vector and one or more second property vectors associated with the one or more second porous rock samples;
select a list of one or more fluid additives based on a comparison of existing enhanced fluid recovery efficiency values associated with the efficiency of the one or more fluid additives used with the one or more similar porous rock samples;
perform, for each of the selected one or more fluid additives, a simulation of a flow of fluid through a digital model of the first porous rock to determine a simulated enhanced fluid recovery efficiency value for each of the respective one or more fluid additives when used with the first porous rock sample; and
output an optimal fluid additive for the first porous rock sample based at least in part on a combination of a comparison of the calculated similarity values, and a comparison of the simulated enhanced fluid recovery efficiency values.

11. The apparatus of claim 10, wherein the at least one memory and the computer program code are configured to, with the at least one processor, cause the apparatus to:
receive an input comprising physical measurement information for the first porous rock sample corresponding to at least one fluid additives in the list; and
determine an experimental enhanced fluid recovery efficiency value for the at least one fluid additive based on the physical measurement information.

12. The method of claim 11, wherein output of the optimal fluid additive for the first porous rock sample is further based on the experimental enhanced fluid recovery efficiency value.

13. The apparatus of claim 11, wherein the experimental enhanced fluid recovery efficiency value and the simulated enhanced fluid recovery efficiency value are based on one or more of:
relative permeability, velocity and pressure fields, sweep efficiency, oil left in place, and recovery percentage.

14. The apparatus of claim 11, wherein the at least one memory and the computer program code are configured to, with the at least one processor, cause the apparatus to:
recalculate the first property vector for the first porous rock sample using at least one of the experimental enhanced fluid recovery efficiency values or the simulated enhanced fluid recovery efficiency values; and
upload the recalculated first property vector to a database comprising the one or more second property vectors.

15. The apparatus of claim 14, wherein the at least one memory and the computer program code are configured to, with the at least one processor, cause the apparatus to:
select a further list of fluid additives for performing a simulation of a flow of fluid through a digital model of a different porous rock sample, wherein the second list of additives is selected based at least in part on the recalculated first property vector.

16. The apparatus of claim 10, wherein the at least one memory and the computer program code are configured to, with the at least one processor, cause the apparatus to receive a user input via an input of a user interface of a fluid additive advisor system comprising at least one of:
metadata information associated with the first porous rock sample; and
physical property information of the first porous rock sample corresponding to at least one further physical property of the first porous rock sample not derived from the digital image,
wherein calculating the first property vector is further based on the metadata information and/or the physical property information of the first porous rock sample.

17. The apparatus of claim 16, wherein:
the metadata information comprises at least one of: global positioning system coordinates corresponding to an extraction locating of the first porous rock sample; a date of the extraction; a source reservoir of the first porous rock sample; and a rock type of the first porous rock sample, and
the further physical properties comprise at least one of: mineralogy information, and chemical composition information.

18. The apparatus of claim 10, wherein the at least one physical property comprises at least one of: a porosity, a tortuosity, a surface-to-volume ratio, and a pore-size distribution.

19. A computer program product for cognitive enhanced oil recovery, the computer program product comprising a computer readable storage medium having program instructions embodied therewith, the program instructions executable by a device to cause the device to:
calculate a first property vector indicative of at least one physical property derived from a digital image of a first porous rock sample;
determine a set of one or more similar porous rock samples by calculating a value indicating a similarity between the first porous rock sample and each of one or more second porous rock samples based on the first property vector and one or more second property vectors associated with the one or more second porous rock samples;

select a list of one or more fluid additives based on a comparison of existing enhanced fluid recovery efficiency values associated with the efficiency of the one or more fluid additives used with the one or more similar porous rock samples;

perform, for each of the selected one or more fluid additives, a simulation of a flow of fluid through a digital model of the first porous rock sample to determine a simulated enhanced fluid recovery efficiency value for each of the respective one or more fluid additives when used with porous rock associated with the first porous rock sample; and output an optimal fluid additive for the first porous rock sample based at least in part on a combination of a comparison of the calculated similarity values, and a comparison of the simulated enhanced fluid recovery efficiency values.

20. The computer program product of claim 19, wherein the program instructions further cause the device to:

receive an input comprising physical measurement information for the first porous rock sample corresponding to at least one fluid additives in the list; and determine an experimental enhanced fluid recovery efficiency value for the at least one fluid additive based on the physical measurement information.

* * * * *